US008642427B1

(12) United States Patent
Sihombing et al.

(10) Patent No.: US 8,642,427 B1
(45) Date of Patent: Feb. 4, 2014

(54) SEMICONDUCTOR DEVICE AND METHOD FOR FABRICATING THE SAME

(75) Inventors: Rudy Octavius Sihombing, Hsinchu (TW); Chia-Hao Lee, New Taipei (TW); Tsung-Hsiung Lee, Taoyuan County (TW); Shang-Hui Tu, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/565,079

(22) Filed: Aug. 2, 2012

(51) Int. Cl.
  *H01L 21/336* (2006.01)
  *H01L 29/76* (2006.01)
(52) U.S. Cl.
  USPC ........... 438/268; 438/514; 438/524; 257/329; 257/335; 257/341
(58) Field of Classification Search
  USPC .......... 438/268, 514, 524; 257/329, 335, 341, 257/E21.418, E29.257
  See application file for complete search history.

(56) References Cited

U.S. PATENT DOCUMENTS 6,987,299 B2 * 1/2006 Disney et al. .................. 257/327
7,075,149 B2 * 7/2006 Sato et al. ..................... 257/335

* cited by examiner

*Primary Examiner* — Theresa T Doan
(74) *Attorney, Agent, or Firm* — Birch, Stewart, Kolasch & Birch, LLP

(57) ABSTRACT

A semiconductor device including a semiconductor substrate of a first conductivity type and an epitaxial layer of the first conductivity type disposed thereon is disclosed. Pluralities of first and second trenches are alternately arranged in the epitaxial layer. First and second doped regions of the first conductivity type are formed in the epitaxial layer and surrounding each first trench. A third doped region of a second conductivity type is formed in the epitaxial layer and surrounding each second trench. A first dopant in the first doped region has diffusivity larger than that of a second dopant in the second doped region. A method for fabricating a semiconductor device is also disclosed.

17 Claims, 7 Drawing Sheets

US 8,642,427 B1

SEMICONDUCTOR DEVICE AND METHOD FOR FABRICATING THE SAME

BACKGROUND OF THE INVENTION

1. Field of the Invention

The present invention relates to a semiconductor device, and in particular, to a method for fabricating a semiconductor device having a super junction structure and a method for manufacturing the same.

2. Description of the Related Art

The conventional vertical diffusion metal-oxide-semiconductor field effect transistor (VDMOSFET) has a p-n junction structure composed of an n-type drift doped region and an overlying p-type base doped region. The p-n junction structure is mainly used to withstand a voltage applied to the conventional VDMOSFET. When improving a withstand voltage of the VDMOSFET, it is required that the doping concentration be reduced and the thickness of the n-type drift doped region be increased. Improvements in the withstand voltage of the p-n junction structure results in increased on-resistance (Ron) for the conventional VDMOSFET. Namely, Ron of the conventional VDMOSFET is limited by the doping concentration of the drift doped region and the thickness of the n-type drift doped region. A VDMOSFET having a super junction structure has been developed to improve the doping concentration of the n-type drift doped region, so that Ron of the VDMOSFET can be improved.

The conventional super junction structure is usually fabricated by multi-epitaxy technology (COOLMOS™). The multi-epitaxy technology requires performing several process cycles of an epitaxy growing process, a p-type dopant implantation process and a thermal diffusion process. Therefore, the multi-epitaxy technology has drawbacks of having plenty of processing steps, and a high fabrication cost. In addition, the dimensions of the VDMOSFET are hard to reduce.

Thus, a method for fabricating a semiconductor device having a super junction structure is desired.

BRIEF SUMMARY OF INVENTION

A semiconductor device and a method for fabricating the same are provided.

An exemplary embodiment of a method for fabricating a semiconductor device comprises providing a semiconductor substrate of a first conductivity type. An epitaxial layer of the first conductivity type is formed on the semiconductor substrate. A plurality of first trenches is formed in the epitaxial layer. A first doped region of the first conductivity type is formed in the epitaxial layer and surrounds each first trench. A second doped region of the first conductivity type is formed in each first doped region and adjacent to each first trench. Each first trench is filled with a first insulating material. A plurality of second trenches is formed in the epitaxial layer and in an alternate arrangement with the plurality of first trenches. A third doped region of a second conductivity type is formed in the epitaxial layer and surrounds each second trench. Each second trench is filled with a second insulating material. The first doped region comprises a first dopant and the second doped region comprises a second dopant, and the first dopant has diffusivity larger than that of the second dopant.

An exemplary embodiment of a semiconductor device comprises a semiconductor substrate of a first conductivity type. An epitaxial layer of the first conductivity type is disposed on the semiconductor substrate. A plurality of first trenches filled with a first insulating material is disposed in the epitaxial layer. A first doped region of the first conductivity type is formed in the epitaxial layer and surrounds each first trench. A second doped region of the first conductivity type is formed in each first doped region and adjacent to each first trench. A plurality of second trenches filled with a second insulating material is disposed in the epitaxial layer and in an alternate arrangement with the plurality of second trenches. A third doped region of a second conductivity type is formed in the epitaxial layer and surrounds each second trench. The first doped region comprises a first dopant and the second doped region comprises a second dopant, and the first dopant has diffusivity larger than that of the second dopant.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
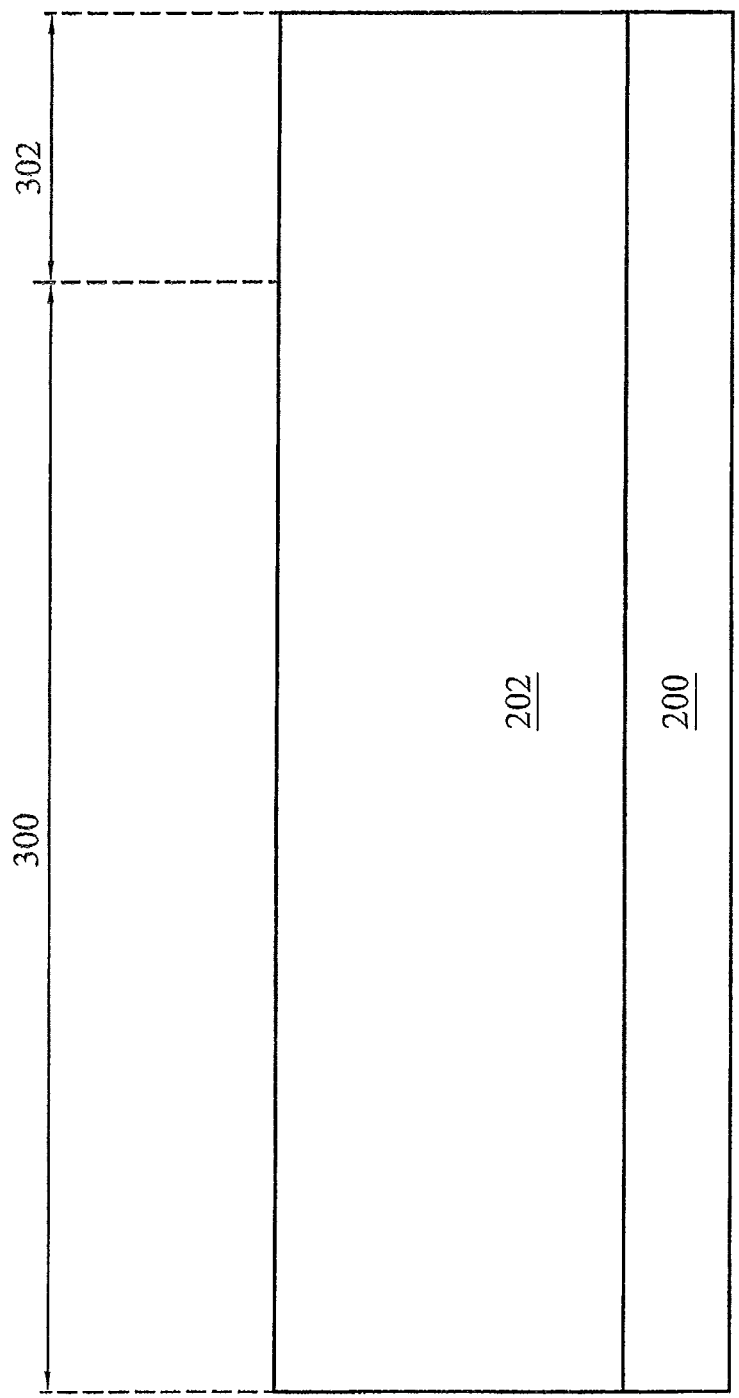
FIGS. 1 to 7 are cross sections of an exemplary embodiment of a method for fabricating a semiconductor device according to the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 7:
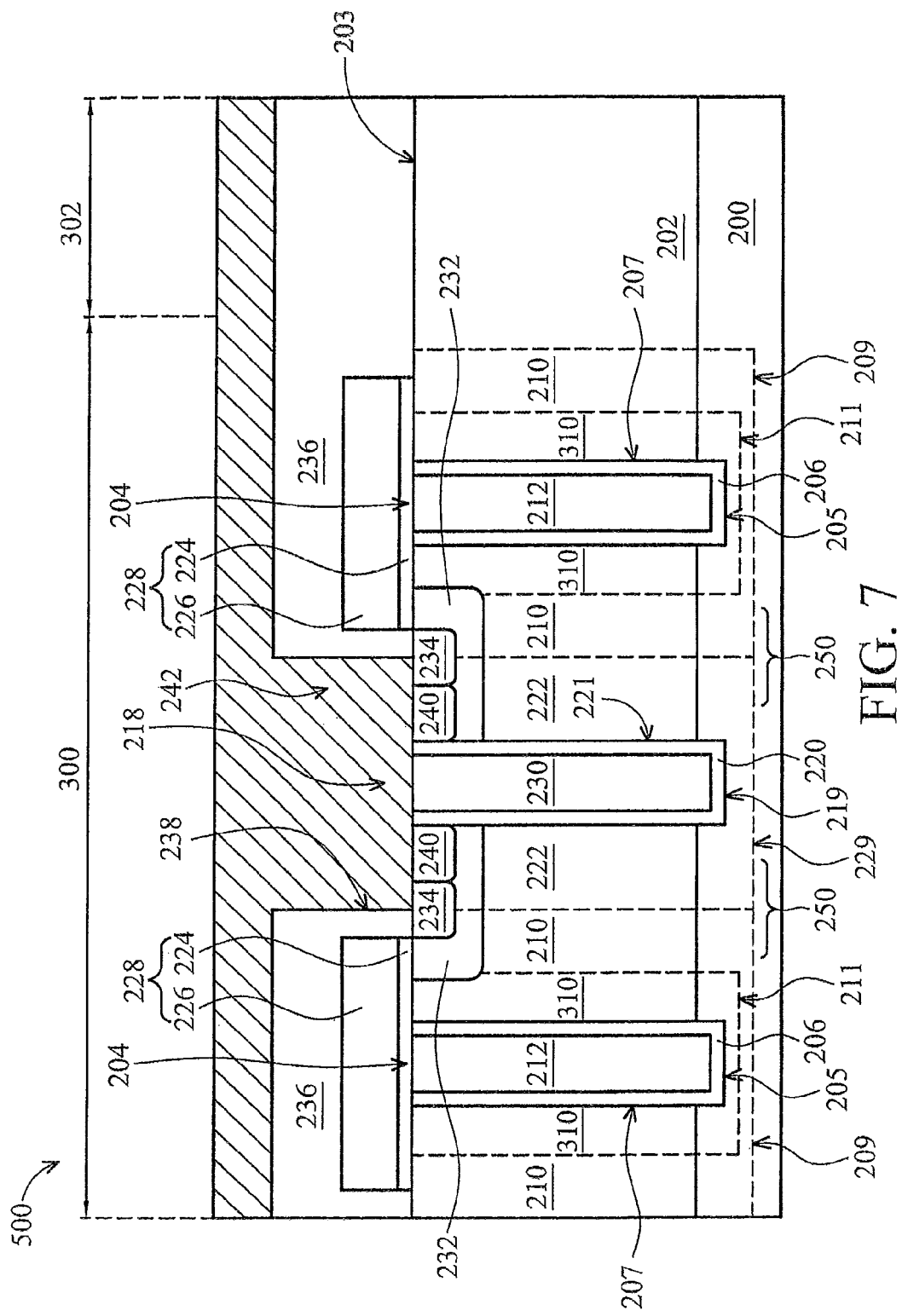

FIG. 7 is a cross section of an exemplary embodiment of a semiconductor device 500 according to the invention. The semiconductor device 500 may comprise a metal-oxide-semiconductor field effect transistor (MOSFET) having super junction structures, for example, a super junction vertical diffusion MOSFET (super junction VDMOSFET). The semiconductor device 500 may comprise a semiconductor substrate 200 of a first conductivity type, and an epitaxial layer 202 of the first conductivity type formed on the semiconductor substrate 200. In the embodiment, the first conductivity type may be a p type or an n type. Moreover, the semiconductor substrate 200 has a doping concentration larger than that of the epitaxial layer 202. For example, the first conductivity type is n type, and the semiconductor substrate 200 may be a heavily doped n-type (N+) semiconductor substrate 200, while the epitaxial layer 202 may be a lightly doped n-type (N−) epitaxial layer 202. The epitaxial layer 202 may comprise an active region 300 and a termination region 302 surrounding the active region 300. The active region 300 is used for placement of semiconductor devices thereon/therein, and the termination region 302 is used as an isolation feature between the semiconductor devices.

The active region 300 of the epitaxial layer 202 may comprise a plurality of first trenches 204 and a plurality of second trenches 218 disposed and alternatively arranged therein, such that each second trench 218 is adjacent to at least one of first trenches 204 or each first trench 218 is adjacent to at least one of the second trenches 218. Here, in order to simplify the diagram, only one second trench 218 and two first trenches 204 adjacent thereto are depicted. The first trenches 204 may extend through the epitaxial layer 202 and into the semiconductor substrate 200 so that bottom surfaces 205 of the first trenches 204 may be located within the semiconductor substrate 200. Similarly, the second trenches 218 may extend through the epitaxial layer 202 and into the semiconductor substrate 200 so that a bottom surface 219 of the second trench 218 may be located within the semiconductor substrate 200. The first and second trenches 204 and 218 extending into the semiconductor substrate 200 may offer advantages such as reduced ion recoil effect when an inner surface (i.e. the sidewalls and the bottoms) of the first and second trenches 204 and 208 is doped. In the case for a super junction VDMOSFET, reducing ion recoil effect when doping the trenches may help lower the on-resistance Ron and increase the breakdown voltage ($V_B$).

A first insulating liner layer 206 may be conformably formed on the inner surface (sidewalls 207 and the bottom surfaces 205) of the first trenches 204. In one embodiment, the first insulating liner layer 206 may be an oxide liner layer, which can be used to release stress from the epitaxial layer 202. In addition, the first insulating liner layer 206 may serve as a pre-implant oxide layer, which is used in a subsequent doping process to reduce channel effects.

A first insulating material 212 is filled into each first trench 204. A top surface 213 of the first insulating material 212 may be substantially aligned to the top surface 203 of the epitaxial layer 202. In one embodiment, the first insulating material 212 may comprise oxides or non-doped polysilicon.

A first doped region 210 of the first conductivity type (e.g., n type) is formed in the epitaxial layer 202 and surrounds each first trench 204, wherein the first doped region 210 may comprise a first dopant. A second doped region 310 of the first conductivity type (e.g., n type) is formed in the first doped region 210 and adjacent to each first trench 204, such that the second doped region 310 surrounds the corresponding first trench 204, wherein the second doped region 310 may comprise a second dopant. The first dopant may have diffusivity larger than that of the second dopant. For example, the first dopant is phosphorus and the second dopant is arsenic. The first doped regions 210 may have a doping concentration larger than that of the epitaxial layer 202 and smaller than that of the semiconductor substrate 200.

A depth of the first doped regions 210 (i.e. a distance between a top surface 203 of the epitaxial layer 202 and bottom surfaces 209 of the first doped regions 210) may be substantially larger than a depth of the second doped regions 310 (i.e. a distance between a top surface 203 of the epitaxial layer 202 and bottom surfaces 211 of the second doped regions 310), and the depth of the second doped regions 310 may be substantially larger than that of the first trenches 204 (i.e. a distance between the top surface 203 of the epitaxial layer 202 and bottom surfaces 205 of the first trenches 204). Therefore, the bottom surfaces 211 of the second doped regions 310 may be positioned within the first doped region 210, and the bottom surfaces 205 of the first trenches 204 may be positioned within the first doped regions 210 and the second doped regions 310.

Similarly, a second insulating liner layer 220 may be conformably formed on an inner surface (sidewalls 221 and the bottom surface 219) of the second trench 218. In one embodiment, the second insulating liner layer 220 may be an oxide liner layer to release stress from the epitaxial layer 202. In addition, the second insulating liner layer 220 may serve as a pre-implant oxide layer, which is used in a subsequent doping process to reduce channel effect.

A second insulating material 230 is disposed in the second trench 218. A top surface of the second insulating material 230 is substantially aligned to the top surface 203 of the epitaxial layer 202. In one embodiment, the second insulating material 230 may comprise oxides or non-doped polysilicon.

A third doped region 222 of a second conductivity type, which is opposite to the first conductivity type, is formed in the epitaxial layer 202 and surrounds the second trench 218. For example, the second conductivity type may be p type, and the third doped region 222 may be a p-type doped region. The third doped region 222 may comprise a third dopant, such as boron, indium, $BF_2$, or combinations thereof. In addition, the third doped region 222 has a doping concentration larger than that of the epitaxial layer 202 and smaller than that of the semiconductor substrate 200.

A depth of the third doped region 222 (i.e. a distance between a top surface 203 of the epitaxial layer 202 and a bottom surface 229 of the third doped region 222) is substantially larger than that of the second trench 218 (i.e. a distance between the top surface 203 of the epitaxial layer 202 and the bottom surface 219 of the second trench 218). Therefore, the bottom surface 219 of the second trench 218 is positioned within the third doped region 222.

A super junction structure 250 may be formed by the first doped regions 210, the second doped regions 310, and the third doped region 222, wherein each of the first doped regions 210 is adjacent to at least one of the third doped regions 222.

A plurality of gate structures 228 may be correspondingly disposed on the plurality of first trenches 204. Each gate structure 228 may comprise a gate oxide layer 224 and an overlying gate layer 226. In one embodiment, each of the gate structures 228 respectively covers one of the plurality of first trenches 204 and a portion of the epitaxial layer 202 adjacent to the covered first trench 204. In addition, the second trench 218 is exposed through the gate structures 228. In one embodiment, the gate oxide layer 224 may comprise oxide, nitride, oxynitride, oxycarbide or combinations thereof. In one embodiment, the gate layer 226 may be a polysilicon layer.

A pair of wells 232 of the second conductivity type is formed in the active region 300 of the epitaxial layer 202 on both sides of the second trench 218, such that the pair of wells 232 is positioned between the two adjacent gate structures 228. Further, the pair of wells 232 is positioned above the third doped regions 222.

A pair of source regions 234 of the first conductivity type (e.g., a pair of n type heavily doped regions) is correspondingly formed in the pair of wells 232. The pair of source regions 234 is adjacent to one side of a corresponding gate structure 228, respectively. In addition, positions of the interfaces between the first doped regions 210 and the third doped regions 222 can be adjusted according the characteristics required by a device. Additionally, the n-type semiconductor substrate 200 may serve as a drain of the formed VDMOSFET.

An interlayer dielectric (ILD) layer 236 having a contact hole 238 may be formed on the epitaxial layer 202 and cover the gate structures 228. It is noted that depending on the design of a device, the number of the contact hole 238 may be two or more. As shown in FIG. 7, a portion of each source region 234 and a portion of each well 232 adjacent to the source region 234 are exposed from the contact hole 238. A pair of pick-up doped regions 240 may be correspondingly formed in the pair of wells 232. The pair of pick-up doped regions 240 may be of the second conductivity type, and each pick-up doped region 240 is adjacent to a corresponding source region 234. A conductive layer may be formed on the ILD layer 236 and filled into the contact hole 238 to form a contact plug 242. The contact plug 242 may serve as a source electrode of the semiconductor device 500.

FIGS. 1 to 7 are cross sections of an exemplary embodiment of a method for fabricating a semiconductor device according to the invention. As shown in FIG. 1, a semiconductor substrate 200 of a first conductivity type is provided. Next, an epitaxial layer 202 of the first conductivity type is formed on the semiconductor substrate 200 by an epitaxy growth process. In the embodiment, the first conductivity type may be p type or an n type. Moreover, the semiconductor substrate 200 has a doping concentration larger than that of the epitaxial layer 202. For example, the semiconductor substrate 200 may be a heavily doped n-type (N+) semiconductor substrate 200, while the epitaxial layer 202 may be a lightly doped n-type (N−) epitaxial layer 202. As shown in FIG. 1, the epitaxial layer 202 may comprise an active region 300 and a termination region 302 surrounding the active region 300.

Figure 2:
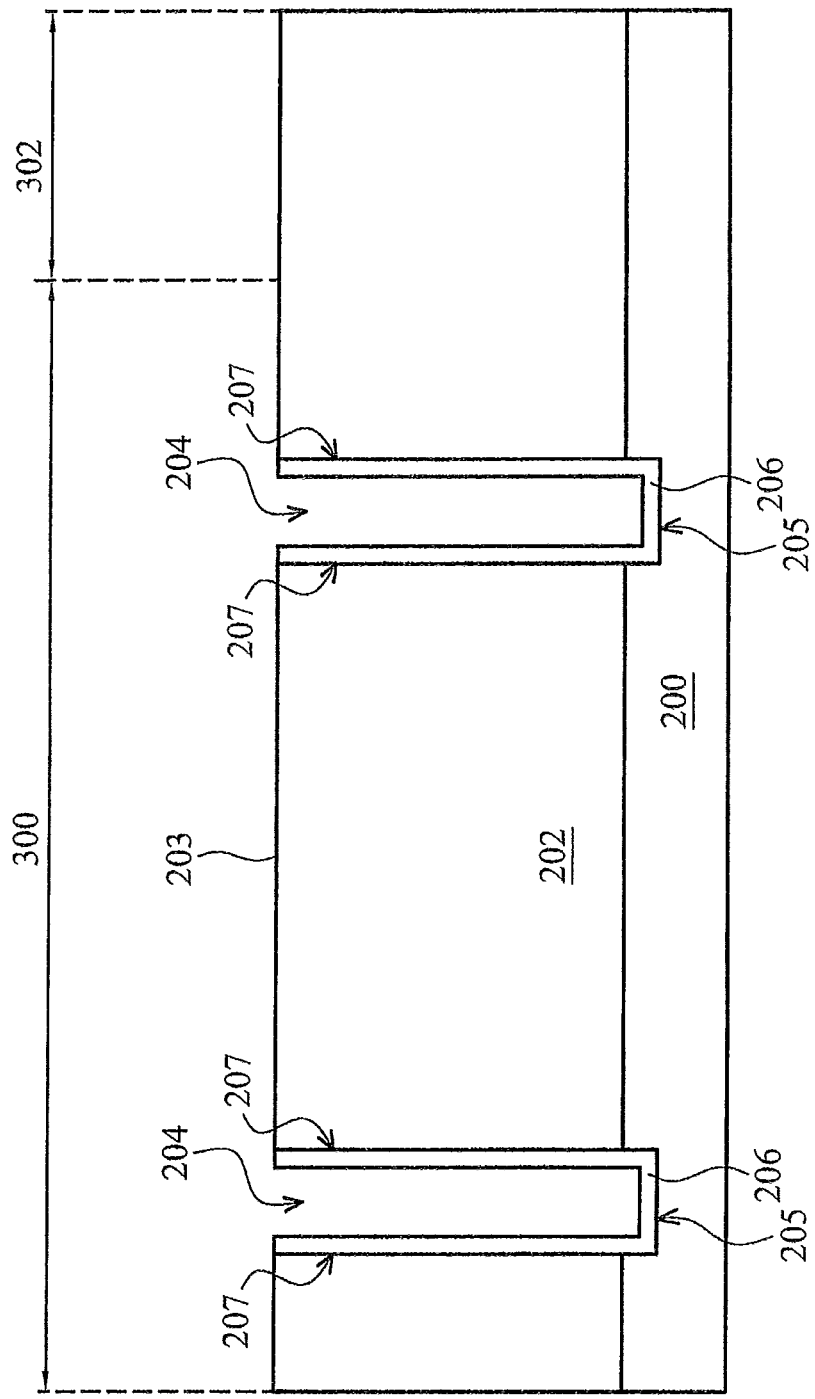

Refer to FIG. 2, wherein the formation of first trenches 204 is described. A hard mask (not shown) is formed on the epitaxial layer 202 by performing a low pressure chemical vapor deposition (LPCVD) process. Next, photolithography and etching processes are performed to form a mask pattern (not shown) covering the active region 300 of the epitaxial layer 202, so that formation of a plurality of first trenches is defined. Next, the epitaxial layer 202 not covered by the mask pattern is etched to form a plurality of first trenches 204 corresponding to the active region 300. In one embodiment, the plurality of first trenches 204 may be extended through the epitaxial layer 202 and into the semiconductor substrate 200, so that bottom surfaces 205 of the first trenches 204 may be located within the semiconductor substrate 200.

Next, a first insulating liner layer 206 is conformably formed on the sidewalls 207 and the bottom surfaces 205 of each first trench 204 by performing a process such as a thermal oxide growing method after removing the mask pattern.

Figure 3:
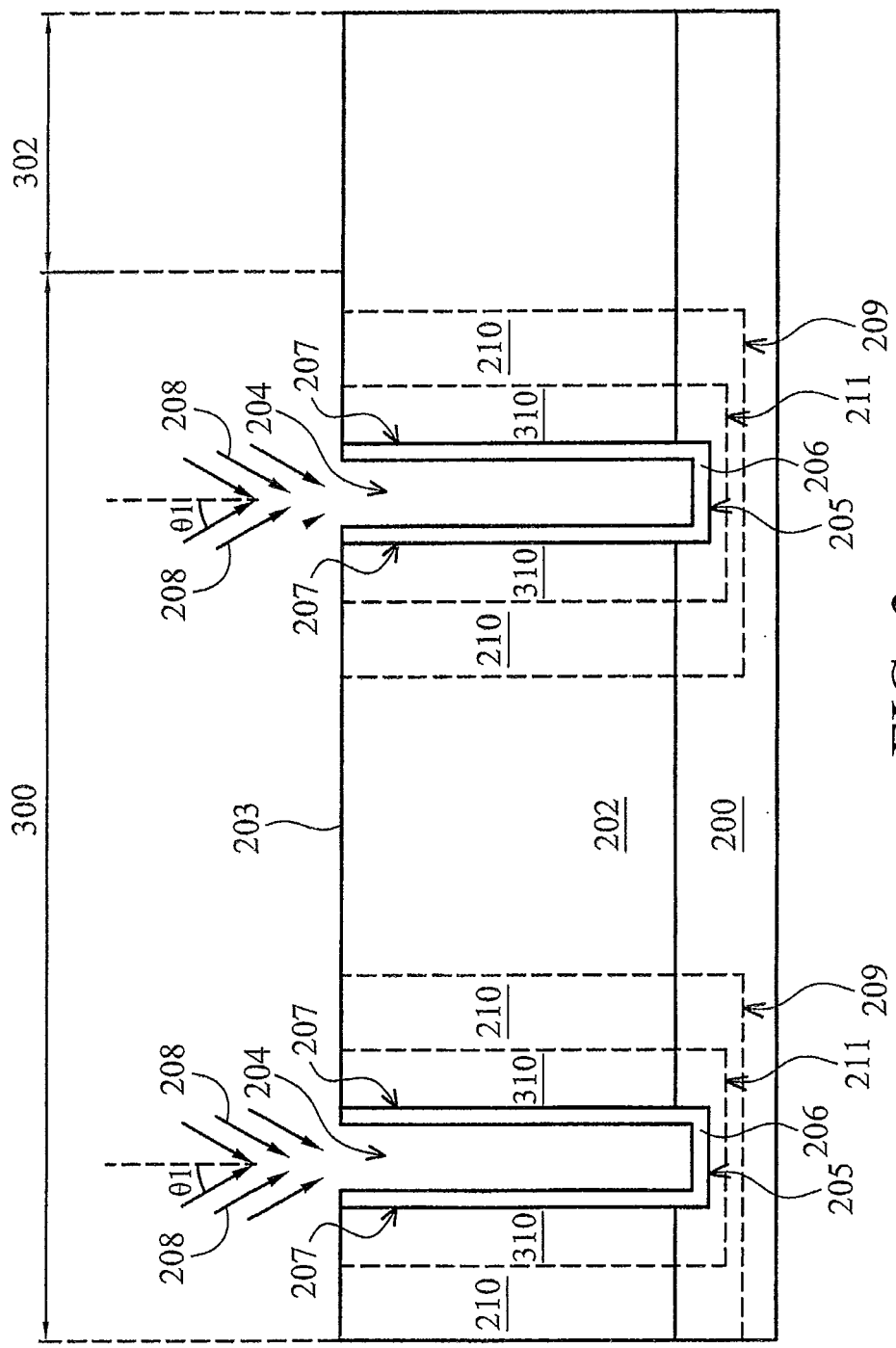

Refer to FIG. 3, a doping process 208, such as a tilted ion implantation process, is performed to dope the epitaxial layer 202 from the two opposite sidewalls 207 of each first trench 204, wherein the epitaxial layer 202 is first doped with a first dopant having a relatively high diffusivity to form a first doped region 210 therein and surrounding each first trench 204. Thereafter, the doping process 208 is still performed with a second dopant having a relatively low diffusivity to form a second doped region 310 in each first doped region 210 and adjacent to each first trench 204, wherein the first dopant and the second dopant have the first conductivity type (e.g. n type). The dopant process 208 for forming the first doped region 210 and the second doped region 310 may be similar or different. In one embodiment, the dopant process 208 for forming the first doped region 210 and the second doped region 310 are different in terms of parameters including doping angle, energy, dose, temperature, or combinations thereof. The term "diffusivity" is used herein to refer to the diffusivity of the first dopant or the second dopant in either the epitaxial layer 202 or the semiconductor substrate 200. In one embodiment, the first dopant may comprise phosphorus, and the second dopant may comprise arsenic, but it is not limited thereto.

It is noted that in the doping process 208, the first dopant having a relatively high diffusivity may penetrate further into the epitaxial layer 202 from an inner surface of each first trench 204 than the second dopant having a relatively low diffusivity. As shown in FIG. 3, each first doped region 210 formed in the epitaxial layer 202 and surrounding each first trench 204 may comprise the first dopant, and each second doped region 310 formed in the first doped region 210 and adjacent to each first trench 204 may surround the corresponding first trench 204 and comprise a second dopant. Each first doped region 210 may have a doping concentration larger than that of the epitaxial layer 202 and smaller than that of the semiconductor substrate 200.

A depth of the first doped regions 210 (i.e. a distance between a top surface 203 of the epitaxial layer 202 and bottom surfaces 209 of the first doped regions 210) is substantially larger than a depth of the second doped regions 310 (i.e. a distance between a top surface 203 of the epitaxial layer 202 and bottom surfaces 211 of the second doped regions 310), and the depth of the second doped regions 310 is substantially larger than that of the first trenches 204 (i.e. a distance between the top surface 203 of the epitaxial layer 202 and bottom surfaces 205 of the first trenches 204). Therefore, the bottom surfaces 211 of the second doped regions 310 are positioned within the first doped region 210, and the bottom surfaces 205 of the first trenches 204 are positioned within the first doped regions 210 and the second doped regions 310.

In one embodiment, a tilt angle θ1 of the doping process 208 is mainly determined by a width and a depth of the first trenches 204. For example, the tilt angle θ1 of the doping process 208 may be between 1 and 10 degrees. In one embodiment, a diffusion process, such as a rapid thermal annealing (RTA) process, may be performed in the first and second doping regions 210 and 310 after performing the doping process 208, thereby activating the dopants therein. A process temperature of the diffusion process may be between about 800° C. and 1500° C., so that the first dopant can be uniformly distributed in the first doped regions 210 and the second dopant can be uniformly distributed in the second doped regions 310.

Figure 4:
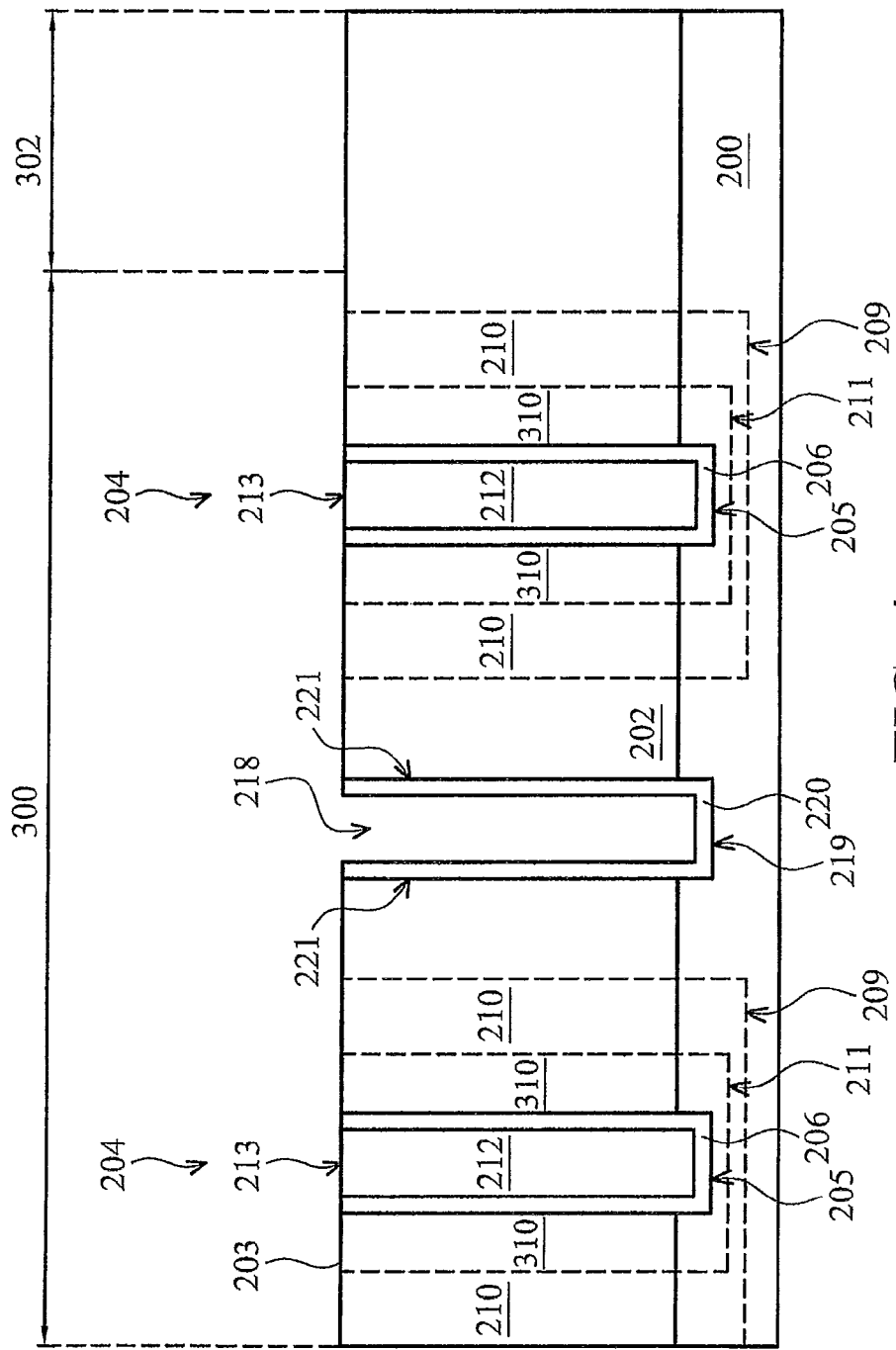

Referring to FIG. 4, a first insulating material 212 is formed on the epitaxial layer 202 and fills each first trench 204 by a deposition process (such as a LPCVD) or a coating process (such as a spin-on glass (SOG) method). Next, a planarization process such as a chemical mechanical polishing (CMP) process is performed to remove the unnecessary first insulating material 212 above the top surface 203 of the epitaxial layer 202, such that a top surface 213 of the first insulating material 212 is substantially aligned to the top surface 203 of the epitaxial layer 202.

Refer to FIG. 4 again, wherein the formation of a second trench 218 is described. Similarly, a hard mask (not shown) is formed on the epitaxial layer 202. Next, photolithography and etching processes are performed to form a mask pattern (not shown) covering the active region 300 of the epitaxial layer 202, so that formation of a plurality of second trenches is defined. Next, the epitaxial layer 202 not covered by the mask pattern is etched to form a plurality of second trenches 218 therein and in an alternate arrangement with the plurality of first trenches 204, such that each second trench 218 is adjacent to at least one first trench 204 or each first trench 218 is adjacent to at least one second trench 218. Also, the plurality of second trenches 218 may be extended through the epitaxial layer 202 and into the semiconductor substrate 200, so that bottom surfaces 219 of the second trenches 218 may be located within the semiconductor substrate 200. The pluralities of first and second trenches 204 and 218, which extend into the semiconductor substrate 200, can prevent a device from earlier breakdown. Here, in order to simplify the diagram, only a second trench 218 between two adjacent first trenches 204 is depicted.

In one embodiment, each first trench 204 may have a width and depth, which is the same as that of each second trench 218. Alternatively, the width and depth of the second trench 218 can be respectively adjusted according characteristics required by a device.

Next, a second insulating liner layer 220 is conformably formed on sidewalls 221 and the bottom surface 219 of the second trench 218 by performing a process such as a thermal oxide growing method after removing the mask pattern.

Figure 5:
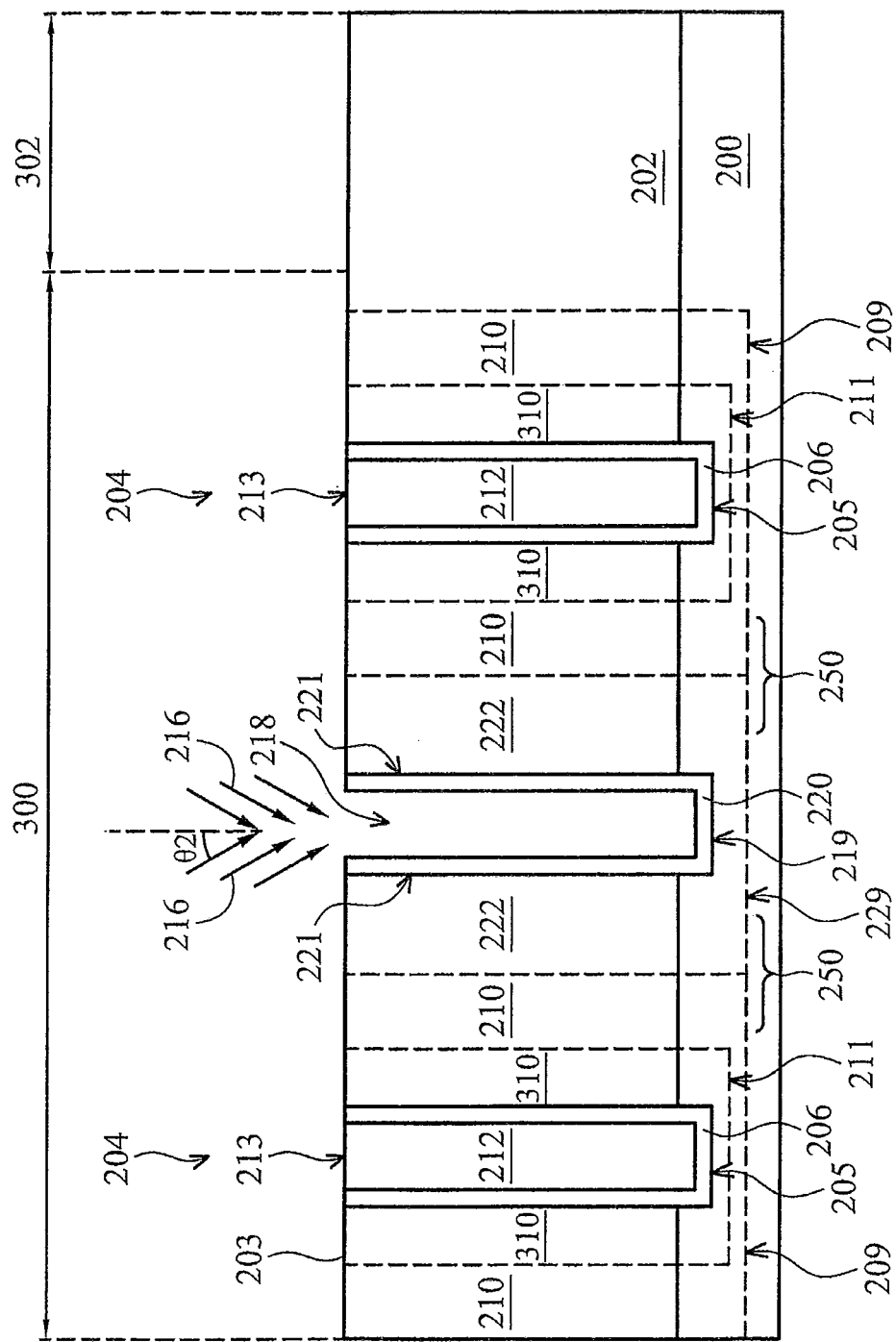

Refer to FIG. 5, wherein a doping process 216, such as a tilted ion implantation process, is performed to dope the epitaxial layer 202 from the two opposite sidewalls 221 of each second trench 218 with a third dopant of a second conductivity type, which is opposite to the first conductivity type, to form a third doped region 222. As shown in FIG. 5, the third doped region 222 substantially surrounds the second trench 218. A depth of the third doped region 222 (i.e. a distance between a top surface 203 of the epitaxial layer 202 and a bottom surface 213 of the third doped region 222) is substantially larger than that of the second trench 218 (i.e. a distance between the top surface 203 of the epitaxial layer 202 and the bottom surface 219 of the second trench 218). Therefore, the bottom surface 219 of the second trench 218 is positioned within the third doped region 222.

Similarly, a tilt angle θ2 of the doping process 216 is mainly determined by a width and a depth of the second trench 218. For example, the tilt angle θ2 of the doping process 216 may be between 1 and 10 degrees. In one embodiment, a diffusion process, such as RTA, may be performed in the third doped region 222 after performing the doping process 216, thereby activating the dopants therein. A process temperature of the diffusion process may be between about 800° C. and 1500° C., so that the third dopant can be uniformly distributed in the third doped region 222.

In one embodiment, the third dopant may comprise boron, $BF_2$, indium, or combinations thereof. In addition, the third doped region 222 has a doping concentration larger than that of the epitaxial layer 202 and smaller than that of the semiconductor substrate 200. It is noted that a dosage of the third dopant may be adjusted to match a total dosage of the first dopant and the second dopant so that a charge balance in the epitaxial layer 202 and the semiconductor substrate 200 between the first and second trenches 204 and 218 can be achieved.

Figure 6:
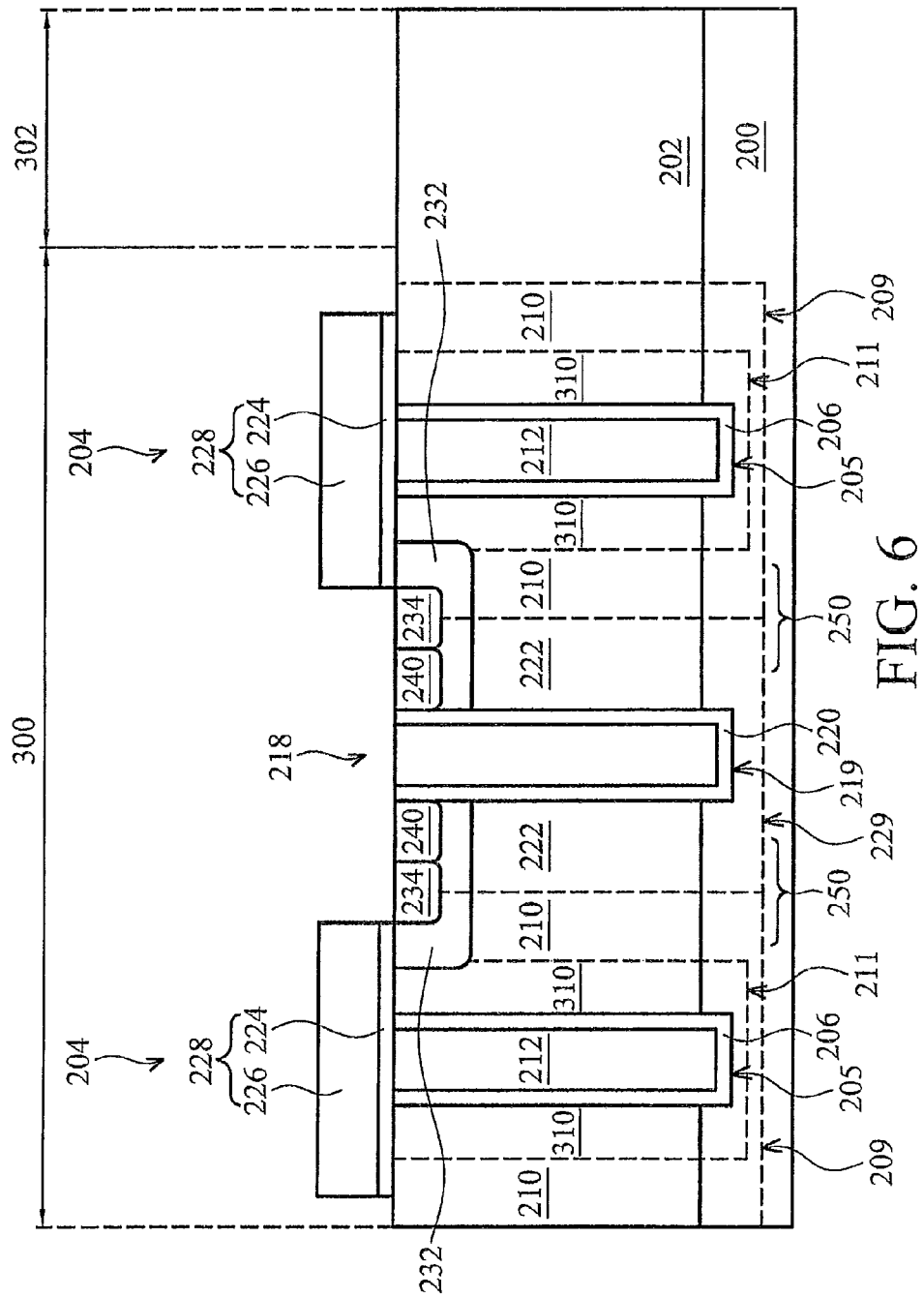

Refer to FIG. 6, each second trench 218 is filled with a second insulating material 230 by a process similar to or the same as that for filling each first trench 204. Next, a planarization process such as a CMP process is performed to remove the unnecessary second insulating material 230 above the top surface 203 of the epitaxial layer 202. In addition, a top surface of the second insulating material 230 is substantially aligned to the top surface 203 of the epitaxial layer 202 after the planarization process is performed. After performing the aforementioned processes, a super junction structure 250 including the first doped regions 210, the second doped regions 310, and the third doped region 222 is formed, wherein each of the first doped regions 210 or the second doped region 212 is adjacent to at least one of the third doped regions 222.

A plurality of gate structures 228 are correspondingly formed on the plurality of first trenches 204. Each gate structure 228 may comprise a gate oxide layer 224 and an overlying gate layer 226. In one embodiment, the gate oxide layer 224 may be formed by thermal oxidation or other conventional deposition processes, such as a chemical vapor deposition (CVD) or atomic layer deposition (ALD) process. Moreover, the gate layer 226 may be formed by a conventional deposition process, such as a physical vapor deposition (PVD), CVD, ALD, sputtering or plating process. In one embodiment, each of the gate structures 228 respectively covers one first trench 204 and a portion of the epitaxial layer 202 adjacent to the covered first trench 204, such that each second trench 218 is exposed through the gate structures 228.

Next, a doping process, such as an ion implantation process, is performed in the epitaxial layer 202 using the gate structures 228 as masks, to form a pair of wells 232 of the second conductivity type in the active region 300 of the epitaxial layer 202 on both sides of each second trench 218, such that the pair of wells 232 is positioned between the two adjacent gate structures 228, respectively. Further, the pair of wells 232 is positioned above the third doped region 222.

Next, another doping process, such as an ion implantation process, is performed using the gate structures 228 as masks to form a pair of source regions 234 of the first conductivity type (e.g. a pair of n type heavily doped regions) correspondingly formed in the pair of wells 232. The pair of source regions 234 is adjacent to one side of a corresponding gate structure 228, respectively. In addition, positions of the interfaces between the first doped regions 210 and the third doped regions 310 can be adjusted according the characteristics required by a device.

A doping process is performed in a portion of the epitaxial layer 202 to form a pair of pick-up doped regions 240 of the second conductivity type therein. As shown in FIG. 6, the pair of pick-up doped regions 240 is formed in the pair of wells 232, and each pick-up doped region 240 is adjacent to a corresponding source region 234.

Refer to FIG. 7, wherein an interlayer dielectric (ILD) layer 236 is formed on the epitaxial layer 202 and covers the plurality of gate structures 228a by, for example, a CVD process. Next, a patterned photoresist layer (not shown) may be formed on the ILD layer 236 for defining contact holes. Next, an anisotropic etching process is performed to remove a portion of the ILD layer 236, thereby forming a contact hole 238 above each second trench 218. As shown in FIG. 7, a portion of each source region 234 is exposed from the contact hole 238.

Next, a conductive layer is formed on the ILD layer 236 and fills each contact hole 238 by a deposition process, such as a sputtering process, to form a contact plug 242 in each contact hole 238. After performing the aforementioned processes, a semiconductor device 500 having a super junction structure 250, for example, a VDMOSFET, is formed. The method for fabricating a semiconductor device 500 uses the n-type VDMOSFET as one exemplary embodiment. Alternatively, the aforementioned first and second conductivity types can be exchanged to fabricate a p-type VDMOSFET.

Compared with the conventional technology, the super junction structure 250 can achieve improved charge balance by controlling the doping concentrations of the n-type doped regions and the p-type doped regions. The doping concentrations of the n-type epitaxial layer can be adjusted according to the design of a device. Additionally, the super junction structure 250 can be fabricated without additional epitaxy growing processes. Therefore, the fabrication cost is reduced. Compared with conventional technologies, semiconductor devices fabricated on the super junction structure 250 may have a smaller size.

In the aforementioned embodiments, by forming the first and second doped regions 210 and 310 comprising dopants with different diffusivities and activating the dopants by annealing (e.g., RTA), Ron can be reduced and breakdown voltage ($V_B$) can be increased. In addition, the first doped regions 210 formed by doping the epitaxial layer 202 with the first dopant in the manner described above in reference to FIG. 1-7 improves the charge balance in the epitaxial layer 202, which increases the breakdown voltage ($V_B$). Further, the second doped regions 310 formed by doping the epitaxial layer 202 with the second dopant in the manner described above in reference to FIG. 1-7 may help direct currents flowing through the semiconductor structure 500 because the second doped regions 310 has a smaller Ron. For example, referring to FIG. 7, the second doped regions 310 may help direct a current (not shown), which flows from the contact plug 242 and through the source regions 234 and the well 232, to flow through the epitaxial layer 202 and the semiconductor substrate 200 in a way that the current flows substantially along the sidewalls of the first trenches 204 in the epitaxial layer 202 and the semiconductor substrate 200. Thus, more current may be driven through the semiconductor device 500 to give a high saturation current.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
    providing a semiconductor substrate of a first conductivity type;
    forming an epitaxial layer of the first conductivity type on the semiconductor substrate;
    forming a plurality of first trenches in the epitaxial layer;
    forming a first doped region of the first conductivity type in the epitaxial layer and surrounding each first trench;
    forming a second doped region of the first conductivity type in each first doped region and adjacent to each first trench;
    filling each first trench with a first insulating material;
    forming a plurality of second trenches in the epitaxial layer and in an alternate arrangement with the plurality of first trenches;
    forming a third doped region of a second conductivity type in the epitaxial layer and surrounding each second trench; and
    filling each second trench with a second insulating material,
    wherein the first doped region comprises a first dopant and the second doped region comprises a second dopant, and the first dopant has diffusivity larger than that of the second dopant.

2. The method of claim 1, wherein the first conductivity type is n type and the second conductivity type is p type, or the first conductivity is p type and the second conductivity is n type.

3. The method of claim 1, wherein the semiconductor substrate has a doping concentration larger than that of the epitaxial layer.

4. The method of claim 1, further comprising:
    performing a first diffusion process in the first doped region; and
    performing a second diffusion process in the third doped region.

5. The method of claim 1, wherein bottom surfaces of the first and second trenches are within the semiconductor substrate.

6. The method of claim 1, wherein the first and second insulating materials comprise oxides or non-doped polysilicon.

7. The method of claim 1, wherein each of the first doped regions is adjacent to at least one of the third doped regions.

8. The method of claim 1, further comprising:
    forming a plurality of gate structures correspondingly disposed on the plurality of first trenches, each comprising a gate oxide layer and an overlying gate layer;
    forming a pair of wells of the second conductivity type in the epitaxial layer on both sides of each second trench; and
    correspondingly forming a pair of source regions of the first conductivity type in the pair of wells.

9. The method of claim 1, wherein the first dopant is phosphorus and the second dopant is arsenic.

10. A semiconductor device, comprising:
    a semiconductor substrate of a first conductivity type;
    an epitaxial layer of the first conductivity type disposed on the semiconductor substrate;
    a plurality of first trenches filled with a first insulating material, disposed in the epitaxial layer;
    a first doped region of the first conductivity type formed in the epitaxial layer and surrounding each first trench;
    a second doped region of the first conductivity type formed in each first doped region and adjacent to each first trench;
    a plurality of second trenches filled with a second insulating material, disposed in the epitaxial layer and in an alternate arrangement with the plurality of second trenches;
    a third doped region of a second conductivity type formed in the epitaxial layer and surrounding each second trench,
    wherein the first doped region comprises a first dopant and the second doped region comprises a second dopant, and the first dopant has diffusivity larger than that of the second dopant.

11. The semiconductor device as claimed in claim 10, wherein the first conductivity type is n type and the second conductivity type is p type, or the first conductivity type is p type and the second conductivity type is n type.

12. The semiconductor device as claimed in claim 10, wherein the semiconductor substrate has a doping concentration larger than that of the epitaxial layer.

13. The semiconductor device as claimed in claim 10, wherein bottom surfaces of the first and second trenches are within the semiconductor substrate.

14. The semiconductor device as claimed in claim 10, wherein the first and second insulating materials comprise oxides or non-doped polysilicon.

15. The semiconductor device as claimed in claim 10, wherein each of the first doped regions is adjacent to at least one of the third doped regions.

16. The semiconductor device as claimed in claim 10, further comprising:
    a plurality of gate structures correspondingly disposed on the plurality of first trenches, each comprising a gate oxide layer and an overlying gate layer;
    a pair of wells of the second conductivity type formed in the epitaxial layer on both sides of each second trench; and
    a pair of source regions of the first conductivity type correspondingly formed in the pair of wells.

17. The semiconductor device as claimed in claim 10, wherein the first dopant is phosphorus and the second dopant is arsenic.

* * * * *